(12) United States Patent
Koelling et al.

(10) Patent No.: US 6,281,760 B1
(45) Date of Patent: *Aug. 28, 2001

(54) ON-CHIP TEMPERATURE SENSOR AND OSCILLATOR FOR REDUCED SELF-REFRESH CURRENT FOR DYNAMIC RANDOM ACCESS MEMORY

(75) Inventors: Jeffrey E. Koelling, Dallas; Wah Kit Loh, Richardson, both of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 2 days.

(21) Appl. No.: 09/356,078

(22) Filed: Jul. 16, 1999

Related U.S. Application Data

(60) Provisional application No. 60/093,905, filed on Jul. 23, 1998.

(51) Int. Cl.$^7$ ................................ H03B 5/24; H03B 5/04
(52) U.S. Cl. .................................. 331/66; 331/57; 331/179
(58) Field of Search .............................. 331/57, 66, 111, 331/143, 176, 177 R, 179

(56) References Cited

U.S. PATENT DOCUMENTS 5,952,892 * 9/1999 Szajda ..................................... 331/57

* cited by examiner

*Primary Examiner*—David Mis
(74) *Attorney, Agent, or Firm*—Wade James Brady, III; Frederick J. Telecky, Jr.

(57) ABSTRACT

A temperature dependent clock circuit (100) is disclosed. The clock circuit (100) includes a reference circuit (102) that provides a first group of reference signals (108) with positive temperature coefficients and a second group of reference signals (110) with negative temperature coefficients. A sample circuit (104) compares the first group of signals (108) with a second group of signals (110) and provides a group of bias signals (112) representative of the operating temperature of the clock circuit (100). A frequency controllable oscillator circuit (106) provides an output clock signal (CLK) having a frequency that is dependent upon the values of the bias signals (112).

40 Claims, 6 Drawing Sheets

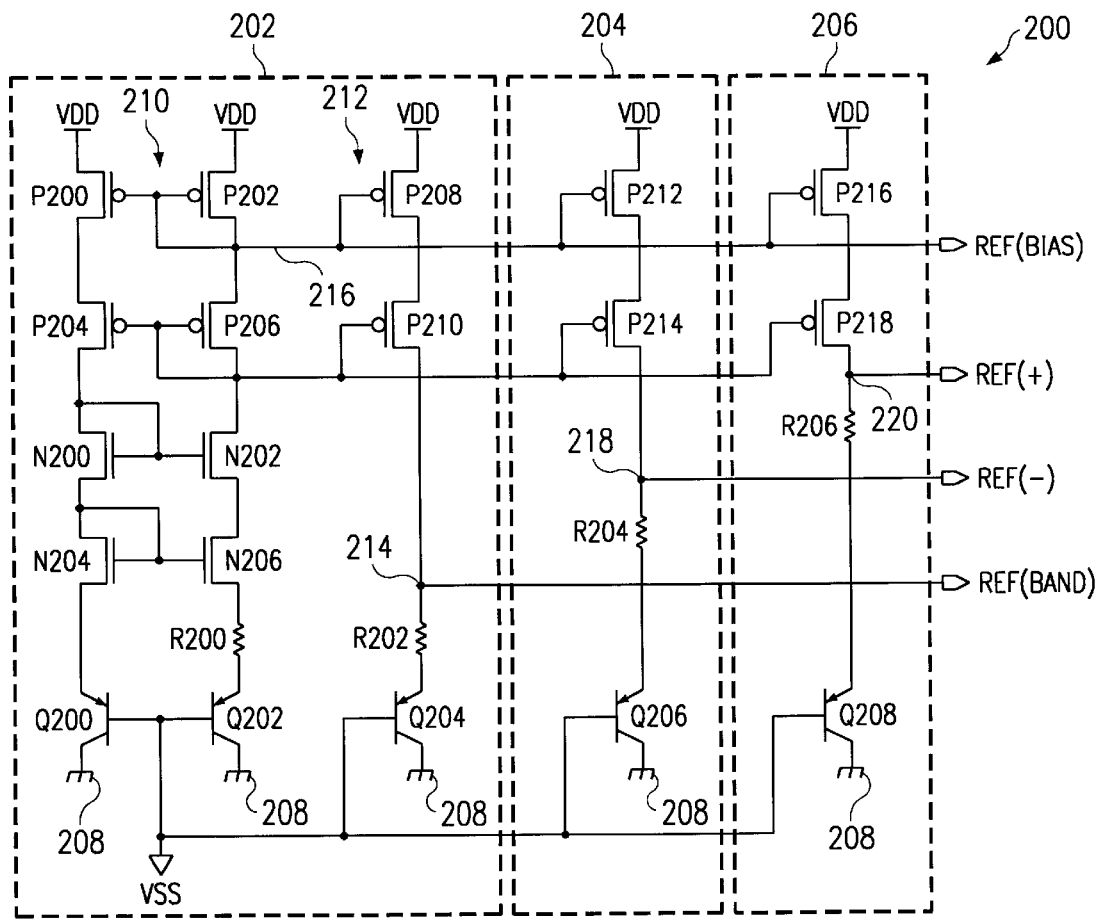
FIG. 2A
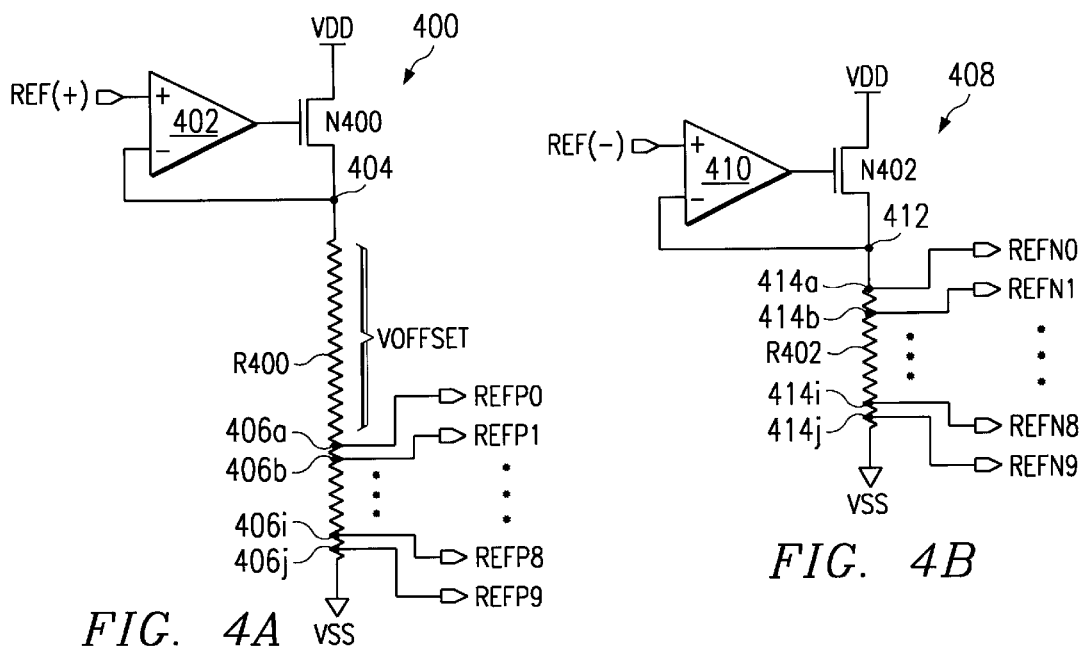
FIG. 4A
FIG. 4B

ON-CHIP TEMPERATURE SENSOR AND OSCILLATOR FOR REDUCED SELF-REFRESH CURRENT FOR DYNAMIC RANDOM ACCESS MEMORY

This application claims priority under 35 USC §119(e)(1) of provisional application No. 60/093,905 filed Jul. 23, 1998.

TECHNICAL FIELD

The present invention relates generally to dynamic random access memories (DRAMs) and more particularly to self-refresh circuits for DRAMs.

BACKGROUND OF THE INVENTION

Dynamic random access memory devices (DRAMs) have continued to be a preferred method for the storage of data in electronic systems. DRAMs, due to their small memory cell size, can store large amounts of data in a very small device. In addition, DRAM memory cells typically consume less power than other memory cell types (such as static RAM cells) making DRAMs a preferred choice in terms of power consumption. At the same time, with the advent of low power electronic devices, such as portable computers and the like, the need to reduce power consumption continues to be an important goal for designers of DRAMs.

DRAMs enjoy relatively low power consumption due to the "dynamic" manner by which they retain data. In most DRAMs, each memory cell includes a storage capacitor that can be charged or discharged. The state of the capacitor (i.e., whether the capacitor is charged or discharged) determines the information (the logic value) stored within the memory cell. For example a charged capacitor can represent a logic "1" while a discharged, capacitor can represent a logic "0." Despite increases in fabrication technology, no capacitor can be manufactured to be free of charge leakage. As a result, once a storage capacitor is charged to a logic "1," as time passes the charge will begin to leak out of the capacitor. If too much time passes, the amount of charge within the storage capacitor will be too low to be detected. Thus, when the data value is read from the capacitor, the capacitor will appear to be discharged to the memory device, and an erroneous logic "0" will be read instead of the correct logic "1" value.

In order to prevent the data corruption in DRAM memory cells that results from charge leakage, the information within each DRAM memory cell must be periodically "refreshed." To accomplish this, the logic values stored within DRAM memory cells are essentially re-written back into the memory cells with a refresh operation. That is, if a memory cell was storing a logic "1" (its storage capacitor was charged), a logic "1" will be written back into the memory cell (recharging the storage capacitor).

Refresh operations, however, must be accomplished while addressing two competing interests. First, the refresh operation must restore data values. Thus, frequent refresh operations are desirable to ensure that data is not corrupted. At the same time, the amount of current required to charge the memory cells results in increased power consumption. Thus, frequent refresh operations are not desirable as they consume power. These competing interests results in each memory cell being refreshed before a maximum "pause" time passes. The pause time is calculated to account for leakage in a memory cell, and helps to ensure that memory cells storing a logic "1" will be refreshed before the amount of charge falls below a detectable level.

In a typical DRAM array, the memory cells of the same row are accessed by activating a word line common to the row. Because of this, the memory cells are refreshed on a row-by-row basis. To ensure that each row is refreshed, the DRAM typically includes a "refresh" counter. The refresh counter is set to an initial row address, resulting in the initial row being refreshed. According to a refresh clock, the refresh counter is then changed (typically by an increment or decrement operation) to a next row address. This results in the next row address being refreshed. Once a last row address has been reached, the refresh counter returns to the initial row address. In this manner, according to the refresh clock, the refresh counter cycles through all of the rows in the memory device. The speed of the refresh counter will thus determine the rate at which memory cells are refreshed. In order to meet the maximum pause time, the refresh counter must typically cycle through all of the row addresses within the maximum pause time.

A DRAM device can be expected to operate over a range of temperatures. This gives rise a problem associated with prior art refresh circuits. While the maximum pause time may be a certain value at one temperature, it can be different at another temperature. In particular, as the operating temperature of a DRAM decreases, parasitic leakage effects are reduced, resulting in longer maximum pause times. The pause time of a DRAM has been found to roughly double for each 15° C. drop in temperature. Thus, as the operating temperature drops, the memory cells do not need to be refreshed as frequently.

Many prior art DRAM refresh clock circuits actually increase in frequency as the temperature drops. Such circuits are not desirable as they will refresh memory cells more often than is necessary, resulting in wasted power. Prior refresh clock circuits have been built which decrease in frequency as the temperature drops. Such circuits have not been able to provide a drop in frequency sufficient to track the substantial increase in pause time.

It would be desirable to provide a refresh clock circuit that provides substantial drops; in clock speed as the temperature decreases.

SUMMARY OF THE INVENTION

According to the preferred embodiment, a clock circuit that provides a temperature dependent clock signal includes a reference circuit that generates a family of reference signals having positive temperature coefficients, and a family of signals having negative temperature coefficients. Each positive temperature coefficient signal is compared to a selected one of the negative temperature coefficient signals. The results of each comparison are used to generate a number of bias signals reflective of the operating temperature of the clock circuit. The bias signals are then used to control the frequency of the clock signal provided by the clock circuit.

According to one aspect of the present invention, the clock circuit is used to drive a refresh counter in a dynamic random access memory (DRAM), and provides a clock signal that decreases in frequency as the operating temperature falls.

According to another aspect of the preferred embodiment, the reference signals having positive and negative temperature coefficients are generated from a band-gap reference circuit.

According to another aspect of the preferred embodiment, the clock circuit includes a ring oscillator for providing the output clock signal. The frequency of the output clock signal is controlled by a supply current provided to the ring oscillator. The bias signals control the magnitude of the supply current.

According to another aspect of the preferred embodiment, the clock circuit includes a number of sample and hold comparator circuits that each compare one of the positive temperature coefficient signals with one of the negative temperature coefficient signals.

An advantage of the preferred embodiment is that it can provide a clock circuit with output clock signal that has significant drops in frequency in response to drops in operating temperature. The significant drops in frequency can more closely follow the increases in the pause time of DRAM memory cells.

BRIEF DESCRIPTION OF THE DRAWINGS

FIG. 2A is a schematic diagram illustrating a first reference circuit that may be used in the preferred embodiment.

FIGS. 4A and 4B are schematic diagrams illustrating family signal generators that be used in the preferred embodiment.

DETAILED DESCRIPTION OF THE EMBODIMENTS

The preferred embodiment is a clock circuit that provides an output clock signal having a frequency that changes in response to changes in operating temperature. The preferred embodiment may be used in a dynamic random access memory (DRAM) to provide a refresh clock signal for a refresh counter or the like. The preferred embodiment provides relatively large drops in frequency as the temperature falls, allowing the refresh operations to more accurately track the resulting increase in memory cell pause time. When utilized in a DRAM, the preferred embodiment takes advantage of existing circuits already present in the DRAM and so does not require a large amount of additional space.

The preferred embodiment can be manufactured as one portion of a larger integrated circuit using conventional fabrication techniques. The particular embodiment described herein is fabricated using complementary metal-oxide-semiconductor (CMOS) technology, that also allows for the formation of diode or bipolar devices.

Figure 1:
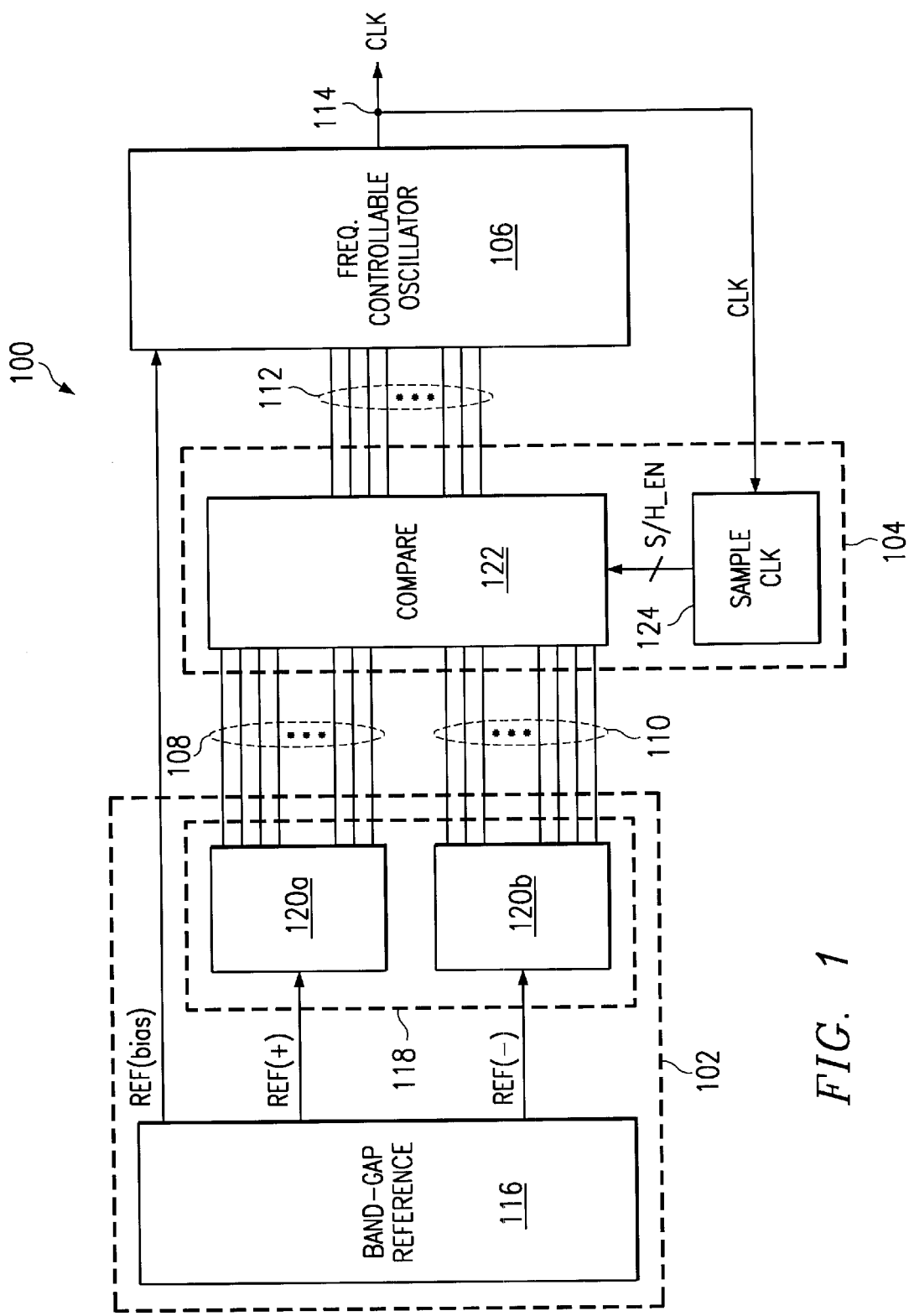
FIG. 1 is a block schematic diagram of the preferred embodiment.

Referring now to FIG. 1, the preferred embodiment clock circuit is set forth in a block schematic diagram and designated by the general reference character 100. The preferred embodiment 100 is shown to include a reference circuit 102, a sampling circuit 104, and a controllable oscillator circuit 106. In general, the reference circuit 102 provides a first group of reference signals 108 and a second group of reference signals 110. The two groups of reference signals (108 and 110) are sampled within the sample circuit 104 to provide an indication of the operating temperature. According to the values of the two groups of reference signals (108 and 110), the sample circuit 104 activates selected bias signals within a bias signal group 112. The controllable oscillator circuit 106 receives the bias signals 112 and provides a periodic output clock signal (CLK) at an output node 114. The frequency of the CLK signal varies according to the values of the bias signals 112.

In the preferred embodiment 100, the first group of reference signals 108 are a family of signals, all of which have a positive temperature coefficient. That is, as the operating temperature increases, the magnitude of the signals of the first group increases. As the temperature decreases, the magnitudes decrease. The second group of reference signals 110 form a family of signals, each having a negative temperature coefficient. Within the sample circuit 104, a given signal from the first group (having a positive temperature coefficient) is compared with a given signal in the second group (having a negative temperature). The results of each comparison are provided as one of the bias signals from the group 112.

Referring once again to FIG. 1, the reference circuit 102 is shown to include a band-gap reference circuit 116 and a family signal generator 118. The band-gap reference circuit 116 provides a first reference signal REF(+) having a positive temperature coefficient, and a second reference signal REF(−) having a negative temperature coefficient. In addition, the band-gap reference circuit 116 also provides a reference bias signal REF(bias). The REF(+) and REF(−) signals are received by the family signal generator 118. The family signal generator 118 includes a first family signal generator 120a and a second family signal generator 120b. The first family signal generator 120a receives the REF(+) signal, and in response thereto, generates the first group of reference signals 108. In the same general fashion, the second family signal generator 120b receives the REF(−) signal, and in response thereto, generates the second group of reference signals 110.

The sample circuit 104 of the preferred embodiment 100 is shown to include a compare circuit 122 and a sample clock circuit 124. The compare circuit 122 performs the function of comparing the signals of the first group 108 with the signals of the second group 110, and in response thereto, provides the bias signals 112 to the controllable oscillator circuit 106. The compare operations within the compare circuit 122 are initiated by timing signals (S/H_EN) provided by the sample clock circuit 124. The sample clock circuit 124 provides the S/H_EN signals response to transitions in the CLK signal. This arrangement provides for greater power savings at lower temperatures. Rather than compare the first group signals 108 and second group signals 110 constantly, or at a fixed frequency, as the temperature drops, the rate at which comparisons take place will also drop.

Referring now to FIG. 2A, a schematic diagram is set forth illustrating a band-gap reference circuit according to a preferred embodiment. The band-gap reference circuit is designated by the general reference character 200 and may be used as the band-gap reference circuit shown as item 116 in FIG. 1. The band-gap reference circuit 200 is shown to include a band-gap portion 202, a negative temperature coefficient leg 204, and a positive temperature coefficient leg 206. The band-gap portion 202 is disposed between the positive power supply voltage VDD and the substrate 208 in which the preferred embodiment is formed. The band-gap portion 202 is further divided in the view of FIG. 2A into a band-gap circuit, identified by the general reference character 210, and band-gap leg 212.

The operation of band-gap circuits 210 are understood by those skilled in the art. Band-gap circuits takes advantage of the fact that the pn junction base-emitter voltage (VBE) of a bipolar transistor has a negative temperature coefficient. At the same time, the thermal voltage (VT) of the bipolar transistors, as well as the resistivity of most resistor materials, have positive temperature coefficients, and so can be used to compensate for the drift in the VBE value. It turns out that the output voltage at which a stable dc reference voltage can be maintained over considerable temperature variation is in the range of +1.25 volts. Band-gap reference circuits derive their name from this voltage, as it is close to the band-gap voltage of silicon.

The band-gap circuit 210 of the preferred embodiment includes a first pair of p-channel metal(conductor)-oxide (insulator)-semiconductor (MOS) transistors, P200 and P202, a second pair of p-channel MOS transistors, P204 and P206, a first pair of n-channel MOS transistors, N200 and N202, and a second pair of n-channel MOS transistors N204 and N206. The first and second pairs of p-channel transistors (P200/P202 and P204/P206) are connected in a current mirror configuration, with the gates of transistors P200 and P202 being commonly coupled to the drain of transistor P202. In a similar fashion, the gates of transistors P204 and P206 are commonly coupled to the drain of transistor P206. The pairs of n-channel transistors (N200/N202 and N204/N206) are also connected in a current mirror configuration. The common gates of transistors N200/N202 and N204/N206 are coupled to the drains of transistors N202 and N206, respectively.

The band-gap circuit 210 further includes a bias resistor R200 and two pnp bipolar transistors, Q200 and Q202. Transistor Q200 has an emitter coupled to the source of transistor N204, a base coupled to the low power supply VSS, and a collector coupled to the substrate 208. Resistor R200 is coupled between the source of transistor N206 and the emitter of transistor Q202. The base of transistor Q202 is coupled to the low power supply VSS, and its collector is coupled to the substrate 208. The band-gap circuit 210 can be conceptualized as having a first current leg that includes the source-drain paths of transistors P200, P204, N200 and N204, and a second current leg that includes the source-drain paths of transistors P202, P206, N202 and N206.

In the embodiment of FIG. 2A, the transistors of the band-gap circuit 210 are identically sized, each having a width-to/length channel ratio (W/L) of 40/5. Resistor R200 has a resistance of 27 kohms. Transistors Q200 and Q202 are not identically sized; the area presented by the base-emitter pn junction of transistor Q202 is eight times greater than that of transistor Q200.

The band-gap leg 212 of the embodiment set forth in FIG. 2A is shown to include the series connection of two p-channel MOS transistors P208 and P210, a reference resistor R202, and a pnp bipolar output transistor Q204. Transistors P208 and P210 have their gates connected to the common gates of transistors P200 P202 and P204/P206, respectively. As a result, the biasing of transistors P208 and P210 mirrors that of the transistor pairs (P200/1P202 and P204/P206). The base of transistor Q204 is coupled to the common bases of transistors Q200 and Q202. The band-gap leg 212, like the current legs of the band-gap circuit 210, is disposed between the high power supply voltage VDD and the substrate 208. Resistor R202 is connected to the drain of transistor P210 at band-gap node 214. The band-gap node 214 provides a band-gap reference voltage REF(band). The common gates of transistors P200, P202 and P208 form a bias node 216 which provides the REF(bias) signals.

In the embodiment of FIG. 2A, the transistors of the band-gap leg 212 have sizes that follow the devices of the band-gap circuit 210, with transistors P208 and P210 having W/Ls of 40/5. The base-emitter area of transistor Q204 is the same as that of transistor Q200.

The arrangement of the band-gap circuit 210 and associated band-gap leg 212 provide a band-gap reference voltage REF(band) that is essentially resistant to variations in temperature and operating voltage. Thus, the REF(band) and REF(bias) voltages can be used to provide stable reference voltages for other circuits of a larger integrated circuit device. However, in the event the resistance value of resistor R202 was changed, the resulting voltage at the band-gap node 214 would exhibit a positive temperature coefficient (for larger values of R202) or a negative temperature coefficient (for smaller values of R202). That is, if resistor R202 had a resistance value that is significantly higher than 290 kohms, as the operating temperature of the circuit falls, so would the voltage at the band-gap node 214. Conversely, if resistor R202 has a resistance value that is significantly lower than 290 kohms, as the operating temperature falls, the potential at the band-gap node 214 would increase.

Figure 3:
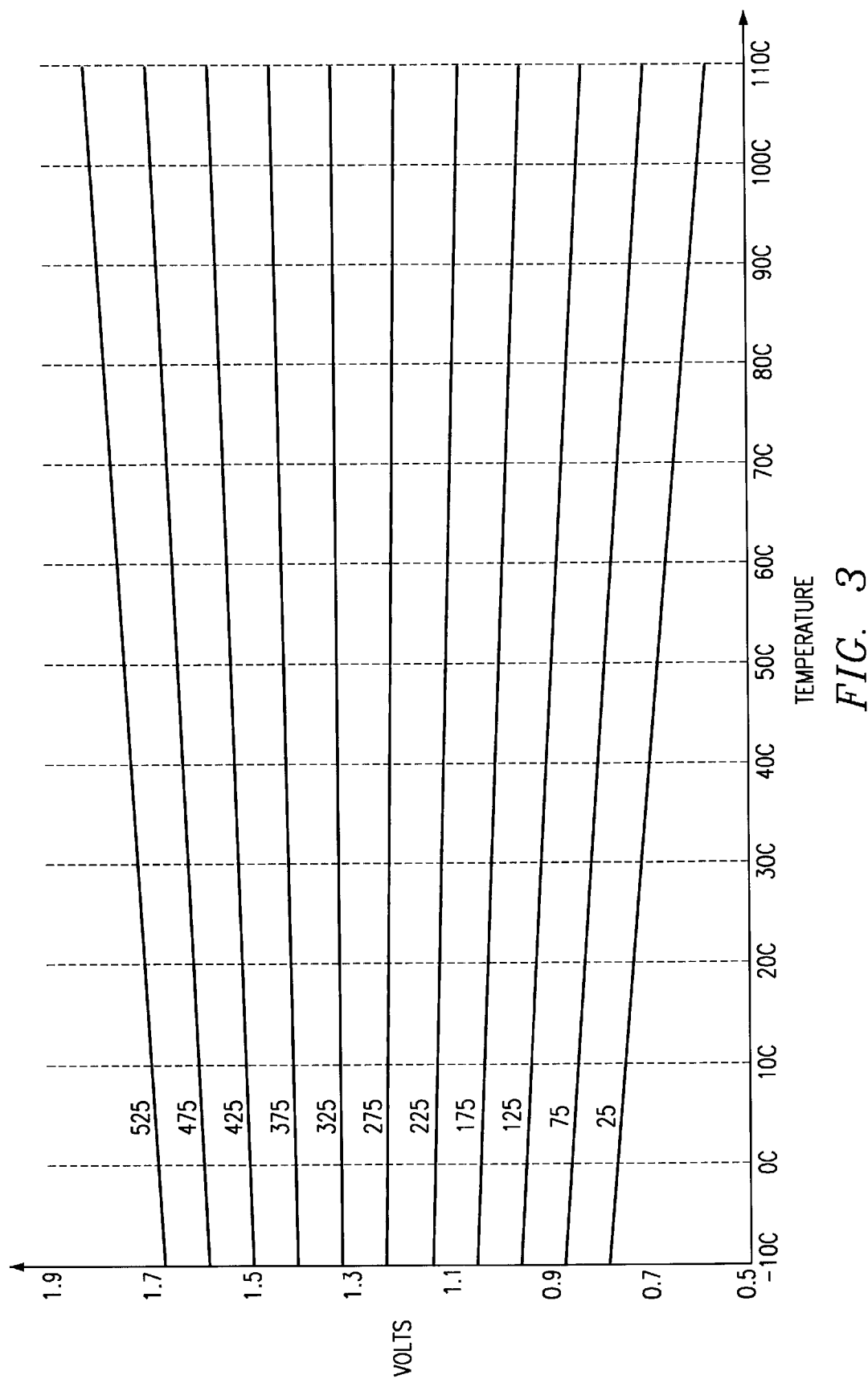
FIG. 3 is a graph illustrating how signals having positive and negative temperature coefficients can be generated from a band-gap reference circuit.

To illustrate the above described temperature response, a graph is set forth in FIG. 3. FIG. 3 demonstrates how variations in the value of R202 affect the temperature response of the voltage REF(band). The graph of FIG. 3 sets forth the response of the REF(band) voltage to eleven values of R202, including 25 kohms, 75 kohms, 125 kohms, 175 kohms, 225 kohms, 275 kohms, 325 kohms, 375 kohms, 425 kohms, 475 kohms and 525 kohms. The vertical axis sets forth the magnitude of REF(band) and the horizontal axis sets forth the operating temperature of the circuit. The various REF(band) waveforms are identified by the resistance value of R202 (in kohms).

As set forth in FIG. 3, the highest illustrative value of R202 (the 525 waveform) has a positive temperature coefficient The four lesser values of R202 have waveforms with smaller positive temperature coefficients, with the 325 waveform exhibiting only a slight rise over increases in temperatures. The lower values of R202 (275 kohms to 25 kohms) have negative temperature coefficients, and fall in magnitude as the temperature increases.

The preferred embodiment advantageously utilizes the capabilities of the band-gap reference circuit to generate reference signals having a positive temperature coefficient and a negative temperature coefficient by comparing the two types of signals to determine the operating temperature. In the particular embodiment of FIG. 2A, the negative temperature coefficient leg 204 provides the negative temperature coefficient reference signal REF(−) and the positive temperature coefficient leg 206 provides the positive temperature coefficient reference signal REF(+).

Referring once again to FIG. 2A, the negative temperature coefficient leg 204 is shown to include many of the same devices as the band-gap leg 212, including two p-channel transistors P212 and P214, arranged in series with a first reference resistor R204 and a pnp bipolar transistor Q206. The connection of resistor R204 to the drain of transistor P214 forms a first reference node 218 that provides the negative temperature coefficient reference signal REF(−). The gate of transistor P212 is coupled to the bias node 216, and the gate of transistor P214 is coupled to the common gates of transistors P204, P206 and P210. The base of transistor Q206 is coupled to VSS. Transistors P212 and P214 have the same W/Ls as transistors P208 and P210, and transistor Q206 has the same size of transistor Q204. The first reference resistor R204 has a value of 25 kohms.

The negative temperature coefficient leg 204 is arranged between the high power supply voltage VDD and the substrate 208, and so mirrors the response of the band-gap leg 212. However, because the resistance of resistor R204 is significantly smaller than that of R202, the REF(−) value will have a negative temperature coefficient.

In the particular embodiment of FIG. 2A, the positive temperature coefficient leg 206 has the same general arrangement as the negative temperature coefficient leg 204, including two p-channel transistors P216 and P218, arranged in series with a second reference resistor R206 and a pnp bipolar transistor Q208. The resistor R206 is coupled to the drain of transistor P218 at a second reference node 220. The second reference node 220 provides the reference signal REF(+). The value of the second reference resistor R206 is substantially greater than that of resistor R202 within the band-gap leg 212. Accordingly, the REF(+) signal will have a positive temperature coefficient signal.

It is noted that a DRAM may already need the band-gap circuit to generate other reference signals. Thus, the preferred embodiment takes advantage of existing circuitry, thereby conserving the amount of space necessary to implement the circuit.

Figure 2B:
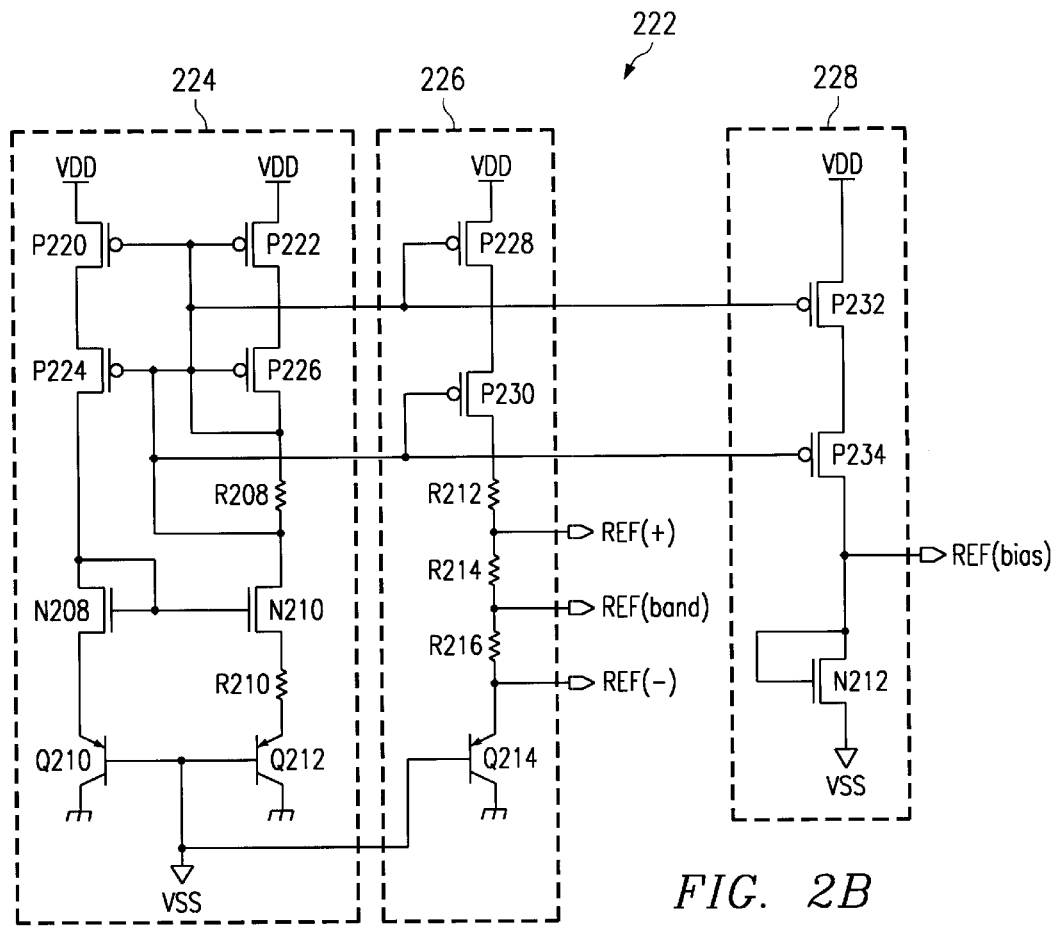
FIG. 2B is a schematic diagram illustrating a second reference circuit that may be used in the preferred embodiment.

A second reference circuit that may be used in the preferred embodiment is set forth in a schematic diagram in FIG. 2B. The second reference circuit is designated by the general reference character 222, and is shown to include a band-gap circuit 224, a reference leg 226, and a bias leg 228. The second reference circuit 222 is similar to that of FIG. 2A, in that it provides a positive temperature coefficient signal REF(+), a negative temperature coefficient signal REF(−), a band-gap reference signal REF(band), and a bias voltage signal REF(bias). The second reference circuit 222 differs from that of FIG. 2A in that the REF(+), REF(−), and REF(band) signals are generated by tapping the single reference leg 226, instead of providing separate legs for a positive temperature coefficient and a negative temperature coefficient.

The band-gap circuit 224 has the same general configuration as that in FIG. 2A, and includes MOS transistor pairs P220/P222, P224/P226 and N208/N210, having commonly connected gates. The MOS transistor pairs are biased differently than the circuit of FIG. 2A. The gates of transistor pair P20/P222 are coupled to the drain of transistor P226. Similarly, the gates of transistor pair P224/P226 are coupled to the drain of transistor N210. The drain of transistor N210 is coupled to the drain of transistor P226 by a resistor R208. This arrangement allows the band-gap circuit 224 to be operational at lower power supply voltages. The remainder of the band-gap circuit 224 is essentially the same as the band-gap circuit shown as item 210 in FIG. 2A, and includes a resistor R210 coupled to the source of transistor N210. A pair of pnp bipolar transistors Q210 and Q212 are arranged in parallel between resistor R210 and the source of transistor N208.

The reference leg 226 is shown to include two p-channel MOS transistors P228 and P230 with source-drain paths arranged in series. The gate of transistor P228 is coupled to the common gates of transistors P220 and P222. The gate of transistor P230 is coupled to the common gates of transistors P224 and P226. Thus, bias levels established in the band-gap circuit 224 are used to bias the current supplying devices of the reference leg 226. The reference leg 226 further includes three alterable resistors (R212, R214 and R216) arranged in series between the drain of transistor P230 and a pnp bipolar transistor Q214. The base of bipolar transistor Q214 is commonly coupled to the common bases of transistors Q210 and Q212, which are commonly coupled to the low power supply voltage VSS. In this arrangement, the reference leg 226 functions like the band-gap leg 212 of the circuit in FIG. 2A, drawing a current based upon bias levels established in the band-gap circuit 224.

The three alterable resistors (R212, R214 and R216) of the reference leg 226 provide the "tap" locations from which to generate the various reference signals. The positive temperature coefficient signal REF(+) is generated by tapping the reference leg 226 at the junction of resistors R212 and R214. The band-gap reference signal REF(band) is generated by tapping the reference leg 226 at the junction of resistors R214 and R216. The negative temperature coefficient signal REF(−) is generated by tapping the reference leg 226 at the junction of resistor R216 and bipolar transistor Q214. In this manner, a more compact structure than that of FIG. 2A can be utilized to generate the various reference signals, as separate legs for each are not required.

The second reference circuit 222 also provides the bias signal REF(bias) at the bias leg 228. The bias leg 228 is shown to include two p-channel MOS transistors P232 and P234 arranged in series. The gates of transistors P232 and P234 are coupled to the gates of transistors P228 and P230, respectively, and so are biased by the same voltages established in the band-gap circuit 224. An active load is created by diode connected transistor N212, which is arranged between the drain of transistor P234 and the low power supply voltage VSS. The active load N212 provides the REF(bias) signal.

Figure 2C:
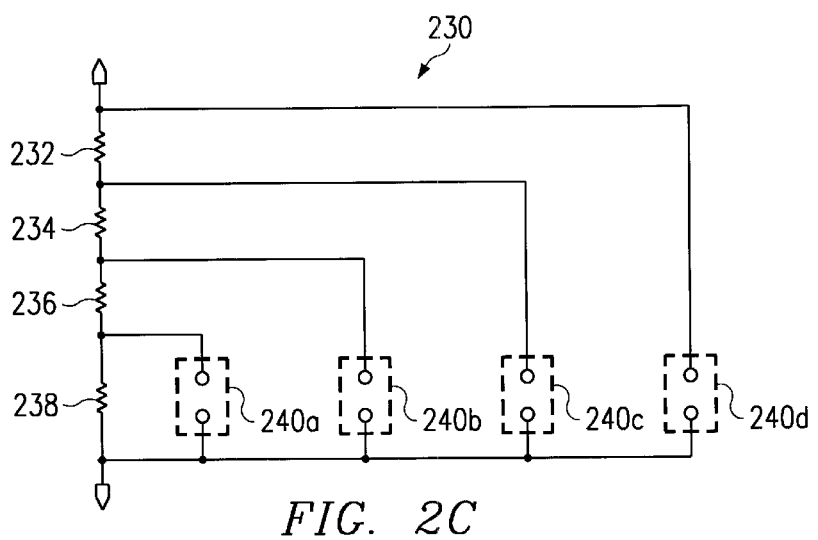
FIG. 2C illustrates an adjustable resistor that may be used in the reference circuits.

It is noted that the resistance values provided by the various alterable resistors of FIGS. 2A and 2B can be used to alter the resistance to achieve the desired temperature coefficient. An example of one possible adjustable resistor is set forth in FIG. 2C. The adjustable resistor is designated by the general reference character 230, and is shown to include a series of resistor elements (232, 234, 236 and 238) arranged in series. The resistor elements (232, 234, 236 and 238) each provide a discreet resistance value. To adjust the overall resistance of the adjustable resistor 230, consecutive groups of resistors may be shorted out by option connections (240a–240d). The option connections (240a–240d) may be "metal" options that can be introduced by way of a particular mask used to form a metal layer in a semiconductor device.

Referring now to FIGS. 4A and 4B, schematic diagrams of a first and a second family signal generator are set forth. The family signal generators may be used as the signal generators 120a and 120b shown in FIG. 1. FIG. 4A sets forth a first family signal generator designated by the general reference character 400. The first family signal generator 400 is shown to include a first op amp 402, a first family current supply transistor N400, and a first tapped resistor R400. The first op amp 402 receives the REF(+) signal at a "+" input, and has an output that is coupled to the gate of the transistor N400. The drain of transistor N400 is coupled to the high power supply voltage VDD. Both the source of transistor N400 and a "−" input of the 402 are connected to a first amplifier voltage node 404. The first tapped resistor R400 is coupled between node 404 and the low power supply voltage VSS. The first op amp 402 and transistor N400 serve to establish a first amplifier voltage at node 404. By operation of the first op amp 402, the first amplifier voltage node 404 will track the REF(+) signal. Thus, as the REF(+) signal rises with increases in temperature, so will the first amplifier voltage node 404.

A first group (or "family") of reference signals (REFP0 to REFP9), each having a positive temperature coefficient, is generated by tapping the first tapped resistor R400 at a number of first signal nodes 406*a* to 406*j* between node 404 and the low power supply voltage VSS. In the preferred embodiment, the reference signals (REFP0–REFP9) are offset from the REF(+) signal by an offset voltage, shown as Voffset in FIG. 4A. In the preferred embodiment Voffset is equal to −0.755 volts. Furthermore, each reference signal is offset from the next by −0.01 volts. Thus, the signal REFP1 is equal to REFP0−0.01 volts, the signal REFP2 is equal to REFP0−0.02 volts, and so on, with the REFP9 signal being equal to REFP0−0.09.

It is understood that in the embodiment of FIGS. 4A and 4B, a resistor is "tapped" in the sense that it represents a single impedance value subdivided into a number of sections. Tapped resistors do not have to be a single contiguous structure, and could represent a number of impedance devices in series.

FIG. 4B sets forth a second family signal generator, designated by the general reference character 408. The second family signal generator 408 includes many of the same circuit components as the first family signal generator 400, including a second op amp 410, a second family current supply transistor N402, and a second tapped resistor R402. The second tapped resistor R402 is disposed between a second amplifier voltage node 412 and the low power supply voltage VSS. As in the case of the first family signal generator 400, a second group of reference signals (REFN0 to REFN9), each having a negative temperature coefficient, is generated by tapping the second tapped resistor R402 at a number of second signal nodes 414*a* to 414*j*. Unlike the arrangement of FIG. 4A, the second family of reference signals (REFN0–REFN9) does not include a significant offset voltage. However, like the REFP0–REFP9 signals, each of the REFN0–REFN9 signals are offset from the next signal by 0.01 volts.

In the preferred embodiment, a first family of reference signals REFP0–REFP9 having positive temperature coefficients is compared with the second family of reference signals (REFN0–REFN9) having negative temperature coefficients. This comparison is used to develop an indication of the operating temperature of a device, and thus determine the frequency of the clock signal provided. To illustrate the nature of this comparison, a graph is set for dt in FIG. 5 that superimposes the responses of the first family of reference signals REFP0–REFP9) on the response of the second family of reference signals (REFN0–REFN9). The vertical axis of the FIG. 5 sets forth the magnitude of the signals, while the horizontal axis illustrates the operating temperature.

Figure 5:
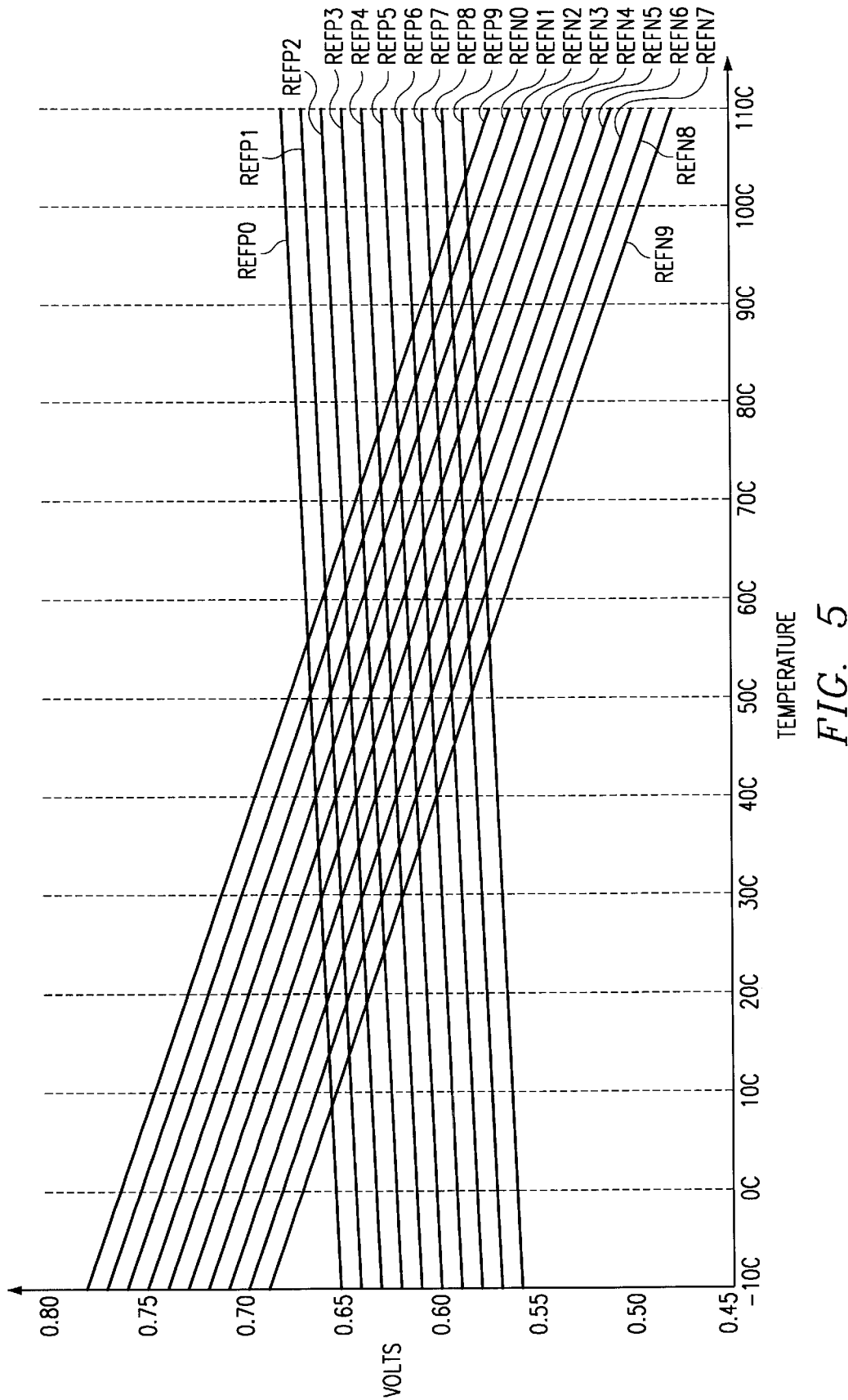
FIG. 5 is a graph illustrating how a family of first signals is compared to a family of second signals to determine an operating temperature.

FIG. 5 further indicates the intersection of each first reference signal with a given second reference signal. The intersections are shown as dots in FIG. 5. For example, the REFP0 signal is shown to intersect the REFN9 signal at an operating temperature of about 10° C., and the REFP1 signal intersects the REFN8 signal at about 20° C. The intersections continue in this manner, with the last intersection shown being the REFP9 signal intersecting the REFN0 signal. The graph of FIG. 5 shows that for any given temperature, a number of positive coefficient signals will be greater than the negative temperature coefficient signal they are shown to intersect with. In particular, at 35° C., the signal REFP0 is greater than its corresponding negative coefficient signal REFN9. Along these same lines the signals REFP1 and REFP2 are greater than REFN8 and REFN7, respectively. In contrast, the signals REFP3–REFP9 are all less than their associated negative temperature coefficient signals, REFN6–REFN0. In another example, at 75° C. the signals REFP0–REFP6 are greater than their corresponding signals REFN9–REFN3, while the signals REFP7–REFP9 are less than the signals REFN2–REFN0, respectively.

Figure 6:
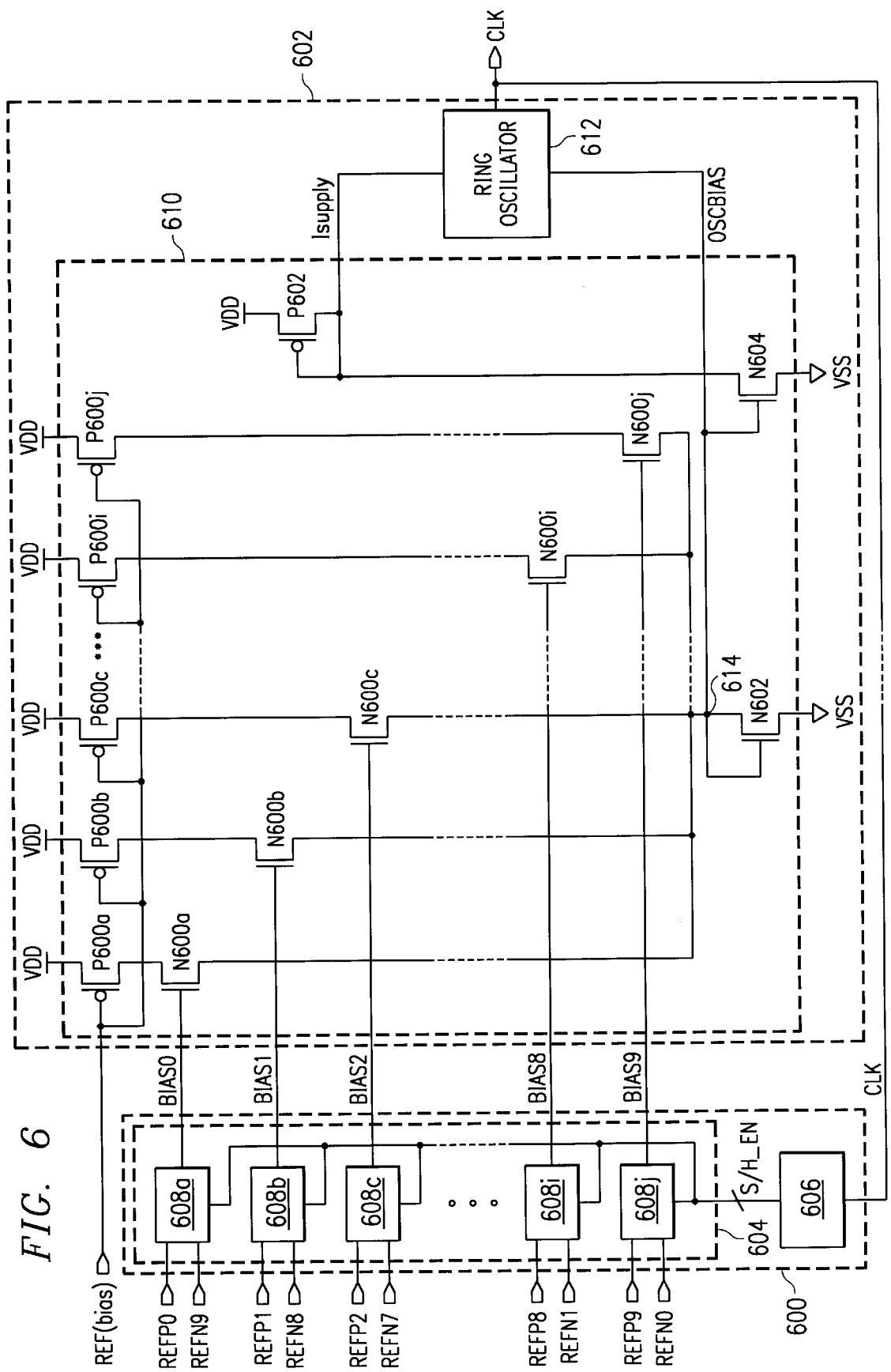
FIG. 6 is a block schematic diagram illustrating a sample circuit and controllable oscillator circuit that may be used in the preferred embodiment.

In the preferred embodiment, in order to generate temperature information, the first family of signals REFP0–REFP9) and second family of signals (REFN0–REFN9) are sampled and compared with one another. Referring now to FIG. 6, a block schematic diagram is set forth illustrating a sample circuit and controllable oscillator circuit that may be used in the preferred embodiment. The sample circuit is designated by the general reference character 600 and may be used as the sample circuit shown as item 104 in FIG. 1. Similarly, the frequency controllable oscillator is designated by the general reference character 602 and may be used as the controllable oscillator shown as item 106 in FIG. 1.

The sample circuit 600 is shown to include a compare circuit 604 and sample clock circuit 606. The compare circuit 604 includes a plurality of sample and hold (S/H) comparator circuits 608*a*–608*j*, each of which receives a selected first reference signal and second reference signal for comparison. As shown in FIG. 6, S/H comparator circuit 608*a* receives the REFP0 and REFN9 signals, and S/H comparator 608*b* receives the next pair of reference signals, REFP1 and REFN8. This pairing continues in the same fashion for the remaining S/H comparators, with the last S/H comparator 608*j* receiving the last pair of reference signals REFP9 and REFN0.

Each S/H comparator (608*a*–608*j*) compares its pair of reference signals and generates an output bias signal (BIAS0–BIAS9) having a logic value dependent upon the results of the comparison. In the preferred embodiment, in the event the positive temperature coefficient signal is greater than its respective negative temperature coefficient signal, the bias signal will be high (a logic "1"). In contrast, in the event the positive temperature coefficient signal is less than its respective negative temperature coefficient signal, the bias signal will be low (a logic "0"). For example, in the event REFP0 is higher than REFN9, the BIAS0 signal will be high. In this manner, the logic values of the bias signals (BIAS0–BIAS9) provide an indication of the operating temperature. Referring back to FIG. 5, at 35° C., the various values of the reference signals (REFP0–REFP9 and REFN0–REFN9) will result in the BIAS0–BIAS2 signals being high, and the BIAS3–BIAS9 signals being low. At 75° C., the BIAS0–BIAS6 signals will be high, while the BIAS7–BIAS9 signals will be low.

By receiving families of essentially analog reference circuits and providing a digital output value (BIAS0–BIAS9), the compare circuit 604 can also be considered a pseudo analog-to-digital converter (A/D). Furthermore, the S/H comparators (608*a*–608*j*) may be formed by utilizing existing sense or differential amplifier circuits, providing for an effective circuit that accomplishes the A/D function in a compact size, without the relatively complex circuits required for a true A/D circuit.

To provide even greater reductions in power, each S/H comparator (608*a*–608*j*) performs its respective compare function and generates its bias signal in synchronism with the output clock signal CLK provided by the controllable oscillator circuit 602. This arrangement helps to reduce current consumption by only periodically performing the sample and hold operation. In the event sense amplifier circuits are used for the S/H comparator circuits (608a–608j), the clock circuits provided by the sample clock circuit 606 will perform same function as conventional sense amplifier enable signals. Thus, it is understood that S/H_EN signals can include a number of timing signals and/or pulses triggered off the CLK signal.

Referring once again to FIG. 6, the controllable oscillator circuit 602 is shown to include a bias circuit 610 and a ring oscillator circuit 612. The bias circuit 610 receives the bias signals (BIAS0–BIAS9) and in response thereto, provides a supply current supply to the ring oscillator 612. The magnitude of the supply current varies according to the various logic values of the bias signals (BIAS0–BIAS9). In this manner, the bias circuit 610 can be conceptualized as an oscillator control circuit, as it controls the operation of ring oscillator 612 according to the bias values.

In the particular embodiment of FIG. 6, the bias circuit 610 includes a current supply device corresponding to each bias signal (BIAS0–BIAS9) that is enabled, or alternatively disabled, according the logic value of its respective bias signal. The current supply devices in FIG. 6 each include a p-channel current supply transistor (P600a–P600j) in series with an n-channel enable transistor (N600a–N600j). Each of the current supply transistors (P600a–P600j) has a source coupled to the high power supply voltage and a gate that receives a bias voltage (the REF(bias) signal from the band-gap circuit 202 of FIG. 2A or 2B). The drain of each of the current supply transistors (P600a–P600j) is coupled to the drain of its associated enabling transistor (N600a–N600j). The gate of each enabling transistor N600a–N600j) receives one of the bias signals (BIAS0–BIAS9). The sources of the enabling transistors (N600a–N600j) are commonly coupled to an oscillator bias node 614.

In this arrangement, the number of current supply transistors (P600a–P600j) that are coupled to the oscillator bias node 614 (and hence the amount of current drawn through the oscillator bias node 614) is directly proportional to the number of active (high) bias signals (BIAS0–BIAS9). The oscillator bias node 614 is coupled to the low power supply voltage VSS by a first load device N602. The first load device N602 is shown to be an n-channel transistor having a gate and drain coupled to the oscillator bias node 614, and a source coupled to the low power supply voltage VSS. By acting as a load for the current supply devices, the potential at the oscillator bias node 614 can be considered a total bias value, as it represents the total number of active bias signals.

The bias circuit 610 further includes a bias mirror leg formed by the series arrangement of a p-channel output load MOS transistor P602 with an n-channel mirror bias transistor N604. The bias mirror leg P602/N604 provides the voltage OSCBIAS to the ring oscillator 612. The magnitude of the OSBIAS voltage is dependent upon the potential at oscillator bias node 614. In this manner, the total bias value is translated from the oscillator bias node 614 to the bias circuit 610. Transistor P602 has a source coupled to the high power supply voltage VDD and a gate coupled to its drain. Transistor N604 has a gate coupled to the oscillator bias node 614 and a source coupled to the low power supply VSS. In this arrangement, as the number of active bias signals (BIAS0–BIAS9) increases, the potential at the oscillator bias node 614 rises. As the potential at node 614 rises, transistor N604 draws the gate/drain of transistor P602 lower. Conversely, as the number of active bias signals (BIAS0–BIAS9) decreases, the OSCBIAS voltage decreases.

The ring oscillator 612 of the embodiment set forth in FIG. 6 can include a number of logic stages arranged into a ring configuration. The logic stages can include inverters, or more complex logic gates, in the event the operation of the oscillator is to be controlled by additional signals. Each logic stage has an input that receives an output signal from a previous stage in the ring, and an output that provides an input signal to the next stage in the ring. The output clock signal CLK is generated from the output of a selected logic stage, and may undergo a number of wave shaping steps. By providing an odd number of logic transitions within the ring, the output clock signal CLK will oscillate. The current necessary to drive the output of each logic stage is provided at a current supply input of the logic stage. The current supply input of each logic stage is commonly controlled by the OSCBIAS voltage. Thus, as the OSCBIAS voltage increases, each logic stage is able to drive its output faster, resulting in a faster oscillating of the CLK signal. In this manner, increases in the magnitude of the OSCBIAS voltage result in faster CLK frequencies. Conversely, decreases in the OSCBIAS voltage will slow down the CLK frequency.

While the particular embodiments disclosed set forth clock circuit that uses a number of signals having positive temperature coefficients and negative temperature coefficients, this should not be construed as limiting the invention the illustrated embodiments. As just one example, fewer number of reference signals could be used. Alternatively, signals having the same temperature response (i.e., both positive or both negative), but different slopes could be used to determine operating temperature.

Accordingly, it is understood that while the present invention has been described in terms of a detailed preferred embodiment, various changes, substitutions, and alterations could be made without departing from the spirit and scope of the invention. Accordingly, the present invention is intended to be limited only as defined by the appended claims.

What is claimed is:

1. In a dynamic random access memory (DRAM) a temperature dependent oscillator circuit, comprising:
   a reference circuit that generates a plural of first reference signals and second reference signals, each first reference signal having a positive temperature coefficient and each second reference signal having a negative temperature coefficient;
   a sample circuit that receives the first reference signals and second reference signals and provides a number of bias signals, the sample circuit including
      a plurality of compare circuits, each compare circuit comparing one of the first reference signals and the one of the second reference signals to provide one of the bias signals, the bias signal of each compare circuit
         being a first logic value when its respective first reference signal is greater than its respective second reference signal, and
         being a second logic value when its respective first reference signal is less than its respective second reference signal;
   a bias circuit that receives the bias signal and generates a total bias value therefrom; and
   a frequency controllable oscillator that receives the total bias value and provides an oscillating output signal having a frequency dependent upon the total bias value.

2. The circuit of claim 1, wherein:
   the reference circuit includes a first tapped impedance device having a high potential end and a low potential end, the first tapped impedance device having a plurality of positive coefficient output nodes coupled between the high potential end and the low potential end, each positive coefficient output node providing one of the first reference signals, and a second tapped impedance device having a high potential end and a low potential end, the second tapped impedance device having a plurality of negative coefficient output nodes coupled between the high potential end and the low potential end, each negative coefficient output node providing one of the second reference signals.

3. The circuit of claim 2, wherein:

the reference circuit includes a positive coefficient amplifier circuit that establishes a first tapped reference voltage at the high potential end of the first tapped impedance device, and a negative coefficient amplifier circuit that establishes a second tapped reference voltage at the high potential end of the first tapped impedance device.

4. The circuit of claim 1, wherein:

the reference circuit includes a band-gap reference circuit.

5. The circuit of claim 4, wherein:

the band-gap reference circuit includes a a positive temperature coefficient current leg having a first reference impedance device having a first impedance value, and a negative temperature coefficient current leg having a second reference impedance device having a second impedance value.

6. The circuit of claim 4, wherein:

the band-gap reference circuit includes a reference leg having a plurality of impedance devices arranged in series, the plurality of impedance devices being tapped to generate at least one signal having a positive temperature coefficient and at least one signal having a negative temperature coefficient.

7. The circuit of claim 1, wherein:

each compare circuit includes an amplifier circuit.

8. The circuit of claim 7, wherein:

the oscillating output signal transitions between a first clock value and a second clock value; and each amplifier circuit is enabled on selected transitions in the oscillating output signal.

9. The circuit of claim 1, wherein:

the bias circuit includes a plurality of current supply devices arranged in parallel between a first power supply node and a frequency bias node, each current supply device receiving one of the bias signals and being enabled when its respective bias signal is at one of the logic values.

10. The circuit of claim 9, wherein:

the bias circuit further includes a load device disposed between the frequency bias node and a second power supply node.

11. The circuit of claim 9, wherein:

the frequency controllable oscillator includes a ring oscillator having a current supply node that provides an oscillator bias voltage that is dependent upon the potential at the frequency bias node.

12. A temperature dependent clock circuit, comprising:

an oscillator circuit having a frequency bias voltage node that receives a frequency bias voltage, and a clock signal output that provides an oscillating output clock signal, the frequency of the output clock signal being dependent upon the magnitude of the frequency bias voltage;

an oscillator control circuit coupled to the oscillator circuit that provides the frequency bias voltage thereto, the oscillator control circuit receiving a plurality of bias signals, and the magnitude of the frequency bias voltage being dependent upon the logic states of the bias signals;

a converter circuit coupled to the oscillator control circuit, the converter circuit receiving a plurality of first reference signals and second reference signals and providing the plurality of bias signals to the oscillator control circuit, the logic states of bias signals being dependent upon a comparison between the first reference signals and the second reference signals; and a reference circuit coupled to the oscillator circuit, the reference circuit providing the plurality of first reference signals and second reference signals, the first reference signals having temperature coefficients that are different from those of the second reference signals.

13. The temperature dependent clock circuit of claim 12, wherein:

the first reference signals are positive temperature coefficient signals and the second reference signals are negative temperature coefficient signals, each positive temperature coefficient signal increasing in magnitude in response to increases in the operating temperature of the clock circuit, each negative temperature coefficient signal decreasing in magnitude in response to increases in the operating temperature of the clock circuit.

14. The temperature dependent clock circuit of claim 12, wherein:

the oscillator circuit includes a ring oscillator having a plurality of logic stages, each including an input, an output, and stage current supply node, the propagation of a logic signal between the input and output of each logic stage being dependent upon the magnitude of the current available at its respective stage current supply node, the logic stages being arranged into a ring, with the input of each logic stage being coupled to the output of a different logic stage, each stage current supply node being commonly coupled to the frequency bias voltage.

15. The temperature dependent clock circuit of claim 12, wherein:

the oscillator control circuit includes a plurality of current supply devices arranged in parallel between a power supply node and a first bias node, each current supply device including a current path and a control terminal, the impedance of the current path being controlled by the control terminal.

16. The temperature dependent clock circuit of claim 15, wherein:

each current supply device includes a first insulated gate field effect transistor (IGFEL) having a source-rain path coupled between the power supply node and the first bias node, the gate of each IGFET being the control terminal and receiving one of the bias signals.

17. The temperature dependent clock circuit of claim 16, wherein:

each current supply device further includes a second IGFET in series with its respective f second IGFET, the second IGFET having a source-drain path in series with the first IGFET.

18. The temperature dependent clock circuit of claim 17, wherein:

each first IGFET is an n-channel IGFET, and each second IGFET is a p-channel IGFET.

19. The temperature dependent clock circuit of claim 17, wherein:
the reference circuit provides a supply bias potential; and the gate of each second IGFET receives the supply bias potential.

20. The temperature dependent clock circuit of claim 15, wherein:
the oscillator control circuit further includes a bias mirror leg coupled to the first bias node, the bias mirror leg providing the frequency bias voltage to the oscillator circuit.

21. The temperature dependent clock circuit of claim 20, wherein:
the bias mirror leg includes a current supply IGFET having source-drain path coupled in series with a bias load IGFET, the bias load IGFET having its gate coupled to the first bias node.

22. The temperature dependent clock circuit of claim 12, wherein:
the converter circuit includes a plurality of comparator circuits, each comparator circuit comparing a selected one of the first reference signals with a selected one of the second reference signals, and providing one of the bias signals as an output.

23. The temperature dependent clock circuit of claim 12, wherein:
the reference circuit includes
a first family signal generator circuit that receives a first bias reference signal having a fist temperature coefficient, and provides the plurality of first reference signals, the responses of the first reference signals following the response of the first bias reference signal, and
a second family signal generator circuit that receives a second bias reference signal having a second temperature coefficient, and provides the plurality of second reference signals, the response of the second reference signals following the response of the second bias reference signal.

24. The temperature dependent clock circuit of claim 23, wherein:
the first family signal generator includes a first signal generator current supply device arranged in series with a first tapped impedance device, the first tapped impedance device including a plurality signal nodes, each providing one of the first reference signals.

25. The temperature dependent clock circuit of claim 24, wherein:
the first signal generator current supply device includes a first generator IGFET having a source-drain path arranged in series with the first tapped impedance device, and the first tapped impedance device includes a resistor.

26. The temperature dependent clock circuit of claim 25, wherein:
the first family signal generator further includes a first operational amplifier having a first input that receives the first reference signal, an output coupled to the gate of the first generator IGFET, and a second input coupled to the drain of the first generator IGFET.

27. The temperature dependent clock circuit of claim 24, wherein:
the second family signal generator includes a second signal generator current supply device arranged in series with a second tapped impedance device, the second tapped impedance device including a plurality of signal nodes, each providing one of the second reference signals.

28. The temperature dependent clock circuit of claim 27, wherein:
the second signal generator current supply device includes a second generator IGFET having a source-drain path arranged in series with the second tapped impedance device, and the second tapped impedance device includes a resistor.

29. The temperature dependent clock circuit of claim 28, wherein:
the second family signal generator further includes a second operational amplifier having a first input that receives the second reference signal, an output coupled to the gate of the second generator IGFET, and a second input coupled to the drain of the second generator IGFET.

30. The temperature dependent clock circuit of claim 12, wherein:
the reference circuit further includes
a first reference leg having a first controllable impedance device, a first reference impedance device coupled in series with the first controllable impedance device at a first reference node, the first reference signal being provided at the first reference node, and
a second reference leg having a second controllable impedance device, a second reference impedance device coupled in series with the second controllable impedance device at a second reference node, the second reference signal being provided at the second reference node and the second reference impedance device having a smaller impedance than the first reference impedance device.

31. The temperature dependent clock circuit of claim 30, wherein:
the reference circuit further includes a band-gap reference circuit, the band-gap reference signal providing a bias signal that controls the impedance of the first controllable impedance device and the second controllable impedance device.

32. In a dynamic random access memory device having a refresh counter that is controlled by refresh clock signal, a method for generating a refresh clock signal comprising the steps of:
generating a plurality of first compare signals having a first set of temperature coefficients;
generating a plurality of second compare signals having a second set of temperature coefficients;
comparing each first compare signal with an associated second compare signal and generating a bias signal having a logic value dependent upon the results of the comparison;
generating a frequency bias voltage having a magnitude that is based upon the logic values of the bias signals; and
providing an output clock signal having a frequency that is dependent upon the magnitude of the frequency bias voltage.

33. The semiconductor device of claim 32, wherein:
the step of generating a plurality of first compare signals includes generating first compare signals having positive temperature coefficients; and the step of generating a plurality of second compare signals includes generating second compare signals having negative temperature coefficients.

34. The semiconductor device of claim 32, wherein:

the step of generating a plurality of first compare signals includes
generating a first reference signal having positive temperature coefficient,
using the first reference signal to generate a voltage across a first impedance device, and
tapping the first impedance device to generate the plurality of first compare signals.

35. The semiconductor device of claim 32, wherein:

the step of generating a plurality of second compare signals includes
generating a second reference signal having negative temperature coefficient,
using the second reference signal to generate a voltage across a second impedance device, and
tapping the second impedance device to generate the plurality of second compare signals.

36. The semiconductor device of claim 32, wherein:

the step of comparing each first compare signal with an associated second compare signal includes
generating a first logic value when the first compare signal is greater than its associated second compare signal, and
generating a second logic value when the first compare signal is less than its associated second compare signal.

37. The semiconductor device of claim 32, wherein:

the step of comparing each first compare signal with an associated second compare signal includes comparing the first compare signal and second compare signal in response to the output clock signal.

38. The semiconductor device of claim 32, wherein:

the step of generating a frequency bias voltage includes
providing a plurality of current supply devices,
providing a load device coupled to the current supply devices, and
enabling each of the current supply devices according to logic values of a selected bias signal.

39. The semiconductor device of claim 32, wherein:

the step of providing an output clock signal includes
providing a ring oscillator circuit that provides a output clock signal having a frequency that increases as the magnitude of the frequency bias voltage increases.

40. A temperature dependent clock circuit, comprising:

an oscillator circuit having a frequency bias voltage node that receives a frequency bias voltage, and a clock signal output that provides an oscillating output clock signal, the frequency of the output clock signal being dependent upon the magnitude of the frequency bias voltage;

an oscillator control circuit coupled to the oscillator circuit that provides the frequency bias voltage thereto, the oscillator control circuit receiving a plurality of bias signals, and the magnitude of the frequency bias voltage being dependent upon the logic states of the bias signals;

a converter circuit coupled to the oscillator control circuit, the converter circuit receiving s plurality of first reference signals and second reference signals and providing the plurality of bias signals to the oscillator control circuit, the logic states of bias signals being dependent upon a comparison between the reference signals and the second reference signals;

a reference circuit coupled to the oscillator circuit, the reference circuit providing the plurality of first reference signals and second reference signals, the first reference signals having temperature coefficients that are different from those of the second reference signals;

wherein the first reference signals are positive temperature coefficient signals and the second reference signals are negative temperature coefficient signals, each positive temperature coefficient signal increasing in magnitude in response to increases in the operating temperature of the clock circuit, each negative temperature coefficient signal decreasing in magnitude in response to increases in the operating temperature of the clock circuit; and wherein the oscillator circuit includes a ring oscillator having a plurality of logic stages, each including an input, an output, and stage current supply node, the propagation of a logic signal between the input and output of each logic stage being dependent upon the magnitude of the current available at its respective stage current supply node, the logic stages being arranged into a ring, with the input of each logic stage being coupled to the output of a different logic stage, each stage current supply node being commonly coupled to the frequency bias voltage.

* * * * *